(12) United States Patent
Yu

(10) Patent No.: US 11,374,195 B2
(45) Date of Patent: Jun. 28, 2022

(54) DISPLAY PANEL AND METHOD OF MANUFACTURING THE SAME, AND DISPLAY APPARATUS

(71) Applicant: BOE Technology Group Co., Ltd., Beijing (CN)

(72) Inventor: Donghui Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/998,161

(22) Filed: Aug. 20, 2020

(65) Prior Publication Data

US 2021/0167322 A1 Jun. 3, 2021

(30) Foreign Application Priority Data

Nov. 29, 2019 (CN) .......................... 201911205720.0

(51) Int. Cl.
*H01L 51/52* (2006.01)
*H01L 51/56* (2006.01)
*H01L 27/32* (2006.01)

(52) U.S. Cl.
CPC .......... *H01L 51/5246* (2013.01); *H01L 27/32* (2013.01); *H01L 51/56* (2013.01);
(Continued)

(58) Field of Classification Search
CPC ............................ H01L 51/5246; H01L 51/56
See application file for complete search history.

(56) References Cited

U.S. PATENT DOCUMENTS 9,761,826 B2 9/2017 Yu et al.
9,917,254 B2 * 3/2018 Luo .................. G01N 21/81
(Continued)

FOREIGN PATENT DOCUMENTS

CN 104037337 A * 9/2014 ......... H01L 2251/30
CN 104037337 A 9/2014
(Continued)

OTHER PUBLICATIONS

Machine translation, Yoshizaki, Japanese Pat. Pub. No. JP 2008-300169A, translation date: Sep. 22, 2021, Espacenet, all pages. (Year: 2021).*
(Continued)

*Primary Examiner* — Victoria K. Hall
(74) *Attorney, Agent, or Firm* — WHDA, LLP

(57) ABSTRACT

Embodiments of the present disclosure provide a display panel and a method of manufacturing the same, and a display apparatus. The display panel includes: a display substrate; a packaging cover plate; a sealing assembly. The sealing assembly includes a box dam structure, a buffer structure and a filling structure, the box dam structure forms a sealing space together with the display substrate and the packaging cover plate, the buffer structure and the filling structure are located in the sealing space, and the buffer structure is located between the box dam structure and the filling structure. The box dam structure is made of a first material, the buffer structure includes a second material, the filling structure is made of a third material, and a viscosity of the second material is greater than a viscosity of the third material and less than a viscosity of the first material.

20 Claims, 3 Drawing Sheets

(52) U.S. Cl.
CPC ........ *H01L 51/529* (2013.01); *H01L 51/5259* (2013.01); *H01L 2251/5369* (2013.01); *H01L 2251/55* (2013.01); *H01L 2251/558* (2013.01)

(56) References Cited

U.S. PATENT DOCUMENTS

| | | | |
|---|---|---|---|
| 10,388,908 B1* | 8/2019 | Yu | H01L 51/5246 |
| 10,707,440 B2* | 7/2020 | Hou | H01L 51/56 |
| 2003/0218422 A1 | 11/2003 | Park et al. | |
| 2009/0009046 A1* | 1/2009 | Oh | H01L 51/5246 |
| | | | 313/1 |
| 2010/0012966 A1* | 1/2010 | Choi | H01L 51/5246 |
| | | | 257/E33.056 |
| 2010/0045177 A1* | 2/2010 | Oh | H01L 51/5246 |
| | | | 313/504 |
| 2010/0045181 A1* | 2/2010 | Oh | H01L 51/5246 |
| | | | 445/25 |
| 2010/0244057 A1* | 9/2010 | Ryu | H01L 51/525 |
| | | | 257/40 |
| 2014/0307407 A1* | 10/2014 | Han | G02F 1/1339 |
| | | | 361/784 |
| 2014/0311668 A1* | 10/2014 | Yanagi | H01L 51/5259 |
| | | | 156/273.7 |
| 2014/0339523 A1* | 11/2014 | Fukagawa | H01L 51/5253 |
| | | | 257/40 |
| 2015/0022079 A1* | 1/2015 | Okumura | H05B 33/04 |
| | | | 313/512 |
| 2015/0179975 A1* | 6/2015 | Nagata | H01L 27/3213 |
| | | | 257/40 |
| 2015/0349288 A1* | 12/2015 | Luo | H01L 51/525 |
| | | | 438/26 |
| 2016/0218312 A1* | 7/2016 | Chang | H01L 51/525 |
| 2016/0293886 A1* | 10/2016 | Yu | H01L 51/5253 |
| 2016/0329519 A1* | 11/2016 | Yu | H01L 51/5259 |
| 2017/0101546 A1* | 4/2017 | Li | C09D 7/61 |
| 2017/0213976 A1* | 7/2017 | Luo | H01L 51/56 |
| 2017/0271615 A1* | 9/2017 | Xu | G03F 1/22 |
| 2017/0279070 A1* | 9/2017 | Wang | H01L 51/5237 |
| 2017/0279076 A1* | 9/2017 | Song | H01L 27/3246 |
| 2018/0205034 A1* | 7/2018 | Liu | C03C 8/24 |
| 2019/0207153 A1* | 7/2019 | Hou | H01L 51/5259 |
| 2019/0305244 A1* | 10/2019 | Jiang | H01L 51/525 |

FOREIGN PATENT DOCUMENTS

| | | | | |
|---|---|---|---|---|
| CN | 203850302 U | * | 9/2014 | ............ H01L 27/32 |
| CN | 203850302 U | | 9/2014 | |
| CN | 104124268 A | | 10/2014 | |
| CN | 104505470 A | | 4/2015 | |
| CN | 107221607 A | * | 9/2017 | ......... H01L 27/3244 |
| CN | 110112323 A | | 8/2019 | |
| CN | 110176549 A | * | 8/2019 | ......... H01L 51/5237 |
| CN | 110176549 A | | 8/2019 | |
| CN | 110350013 A | | 10/2019 | |
| JP | 2008-300169 A | * | 12/2008 | ............ H01L 51/50 |
| WO | WO 2018205690 A1 | * | 11/2018 | ............ H01L 51/50 |

OTHER PUBLICATIONS

Machine translation, Song, Chinese Pat. Pub. No. CN104037337A, translation date: Feb. 9, 2022, Espacenet, all pages. (Year: 2022).*
Machine translation, Yang, Chinese Pat. Pub. No. CN110176549A, translation date: Feb. 9, 2022, Espacenet, all pages. (Year: 2022).*
Machine translation, Hong, Chinese Pat. Pub. No. CN203850302U, translation date: Feb. 9, 2022, Espacenet, all pages. (Year: 2022).*
Office Action dated Aug. 27, 2021, issued in counterpart CN application No. 201911205720.0, with English translation. (18 pages).
Office Action dated May 9, 2022, issued in counterpart CN Application No. 201911205720.0, with English Translation. (17 pages).

* cited by examiner

DISPLAY PANEL AND METHOD OF MANUFACTURING THE SAME, AND DISPLAY APPARATUS

CROSS-REFERENCE TO RELATED APPLICATION

This application claims priority of Chinese Patent Application No. CN201911205720.0 filed on Nov. 29, 2019 in China National Intellectual Property Administration, the disclosure of which is incorporated herein by reference in entirety.

TECHNICAL FIELD

The present disclosure relates to the field of display technology, and in particular, to a display panel and a method of manufacturing the same, and a display apparatus.

BACKGROUND

Organic light emitting diode (OLED) display technology (organic electroluminescence display technology) is a display lighting technology that has been gradually developed in recent years, especially in the display industry. It has the advantages of high response, high contrast, flexibility, etc., and has a wide range of application prospects. However, OLED devices will be corroded and damaged under the action of water vapor and oxygen. At present, encapsulation methods such as Dam & Fill and Face Seal are usually used to encapsulate OLED devices to reduce the adverse influence of water and oxygen on the OLED devices.

However, the encapsulation structure in the organic light emitting diode display panel still needs to be improved.

SUMMARY

According to an aspect of the present disclosure, there is provided a display panel, comprising:
a display substrate;
a packaging cover plate opposite to the display substrate;
a sealing assembly located between the display substrate and the packaging cover plate, and connecting the display substrate to the packaging cover plate;
wherein the sealing assembly comprises a box dam structure, a buffer structure and a filling structure, the box dam structure forms a sealing space together with the display substrate and the packaging cover plate, the buffer structure and the filling structure are located in the sealing space, and the buffer structure is located between the box dam structure and the filling structure;
wherein the box dam structure is made of a first material, the buffer structure comprises a second material, the filling structure is made of a third material, and a viscosity of the second material is greater than a viscosity of the third material and less than a viscosity of the first material.

According to some embodiments of the present disclosure, the display substrate is an organic electroluminescence display substrate.

According to some embodiments of the present disclosure, the buffer structure is flexible.

According to some embodiments of the present disclosure, the viscosity of the second material is greater than 10000 cp.

According to some embodiments of the present disclosure, the second material comprises a resin material.

According to some embodiments of the present disclosure, the second material is doped with metal oxide.

According to some embodiments of the present disclosure, the second material is doped with nanoparticles.

According to some embodiments of the present disclosure, the box dam structure and the buffer structure are both a ring-shaped structure arranged at an edge of the display substrate, the buffer structure is located at a side of the box dam structure close to the sealing space, and the filling structure is filled in the sealing space.

According to some embodiments of the present disclosure, the buffer structure has openings.

According to some embodiments of the present disclosure, the buffer structure is a continuous ring-shaped structure.

According to some embodiments of the present disclosure, in a cross section of the buffer structure parallel to the display substrate, a thickness of the buffer structure at a corner is greater than a thickness of the buffer structure at remaining areas.

According to some embodiments of the present disclosure, the viscosity of the first material is greater than 100000 cp.

According to some embodiments of the present disclosure, the first material comprises a resin material.

According to some embodiments of the present disclosure, the viscosity of the third material is less than 1000 cp.

According to some embodiments of the present disclosure, the third material comprises at least one of a resin material, a silicon material, or an acrylic material.

According to another aspect of the present disclosure, there is provided a method of manufacturing a display panel, comprising:
providing a packaging cover plate, coating the packaging cover plate with a first material for forming a box dam structure, a second material for forming a buffer structure, and a third material for forming a filling structure, a viscosity of the second material being greater than a viscosity of the third material and less than a viscosity of the first material;
aligning and fitting a display substrate with the packaging cover plate, and performing a curing treatment on the first material, the second material, and the third material to form the box dam structure, the buffer structure, and the filling structure, the box dam structure forming a sealing space together with the display substrate and the packaging cover plate, the buffer structure and the filling structure being located in the sealing space, and the buffer structure being located between the box dam structure and the filling structure.

According to some embodiments of the present disclosure, the display substrate is an organic electroluminescence display substrate.

According to some embodiments of the present disclosure, the buffer structure after performing the curing treatment is flexible.

According to some embodiments of the present disclosure, the curing treatment comprises an ultraviolet light curing, a thermal curing, or a visible light curing.

According to another aspect of the present disclosure, there is provided a display apparatus comprising the display panel according to any one of the above embodiments.

BRIEF DESCRIPTION OF THE DRAWINGS

The above and/or additional aspects and advantages of the present disclosure will become obvious and easy to understand from the description of the embodiments in conjunction with the following drawings, in which.

DETAILED DESCRIPTION OF EMBODIMENTS

Figure 1:
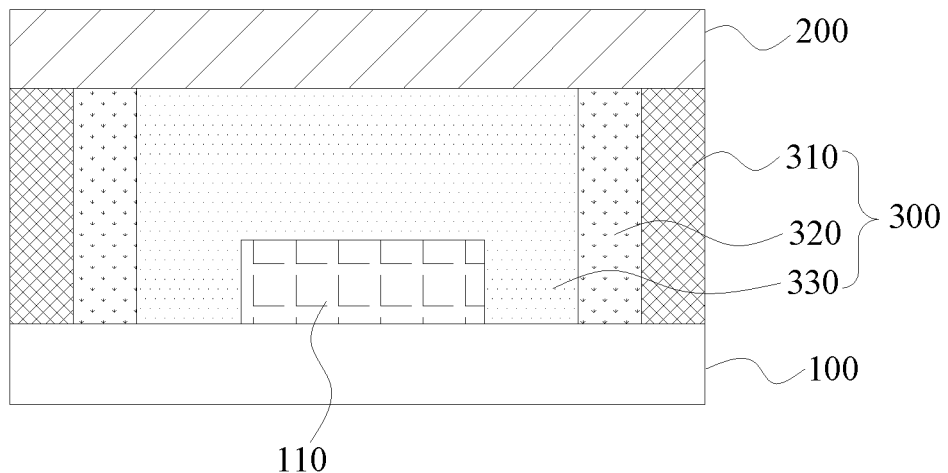
FIG. 1 shows a schematic structural diagram of a display panel according to an embodiment of the present disclosure.

The embodiments of the present disclosure are described in detail below. Examples of the embodiments are shown in the accompanying drawings, wherein the same or similar reference numerals indicate the same or similar elements or elements with the same or similar functions. The embodiments described below with reference to the accompanying drawings are exemplary, and they are only used to explain the present disclosure, but should not be understood as a limitation to the present disclosure.

The embodiments of the present disclosure are made based on the inventor's discovery and recognition of the following facts and problems.

At present, the packaging structure of the OLED device still has the problem of poor packaging effect, which affects the service performance and service life of the OLED device. For example, in the Dam & Fill package, due to the difference between the viscosities of the Dam glue and the Fill glue and the difference between the curing processes thereof, bubbles, uneven edges, glue flushing and the like are prone to appear at the junction of the Dam glue and the Fill glue, which seriously affects the packaging effect of the package structure and the reliability level of the product. In addition, the inventor also found that the viscosity of the Dam glue in the current Dam & Fill package structure needs to be large enough (much greater than the viscosity of the Fill glue) to reduce the phenomenon of glue flushing. However, due to the above-mentioned viscosity conditions, the selection range of materials for Dam glue and Fill glue is relatively narrow, making the matching of Dam glue and Fill glue to be difficult.

The embodiments of the present disclosure aim to alleviate or solve at least one of the aforementioned problems at least to some extent.

In one aspect of the present disclosure, embodiments of the present disclosure provide a display panel. According to an embodiment of the present disclosure, referring to FIG. 1, the display panel includes: an organic electroluminescence display substrate 100, a packaging cover plate 200, and a sealing assembly 300. The organic electroluminescence display substrate 100 is disposed opposite to the packaging cover plate 200, and the sealing assembly 300 connects the organic electroluminescence display substrate 100 to the packaging cover plate 200. The sealing assembly 300 includes a box dam structure 310, a buffer structure 320 and a filling structure 330. The box dam structure 310 forms a sealing space together with the organic electroluminescence display substrate 100 and the packaging cover plate 200. The buffer structure 320 and the filling structure 330 are located in the abovementioned sealing space, and the buffer structure 320 is located between the box dam structure 310 and the filling structure 330. The box dam structure 310 is made of a first material, the buffer structure 320 includes a second material, and the filling structure 330 is made of a third material. The viscosity of the second material is greater than that of the third material and less than that of the first material, and the buffer structure 320 is sticky. Therefore, by providing the buffer structure between the box dam structure and the filling structure, and by connecting the box dam structure to the filling structure through the buffer structure, that is, the box dam structure and the filling structure are not in direct contact with each other, the stability of the morphology of the box dam structure can be guaranteed, which effectively alleviates the problems of bubbles, uneven edges and glue flushing at the junction of the box dam structure and the filling structure, improves the sealing effect of the sealing assembly, increases the reliability of the display panel. The addition of the buffer structure can also reduce the viscosity difference between the box dam structure and the filling structure in the selection of materials, and increase the selection range of the viscosities of the material of the box dam structure (i.e., the first material) and the material of the filling structure (i.e., the third material), making the material of the box dam structure and the material of the filling structure easier to match.

It should be noted that the "box dam structure" mentioned herein refers to a structure that is formed by curing the first material and forms the sealing space with the organic electroluminescence display substrate and the packaging cover plate, that is, the height of this structure at all parts is the same, and this structure can connect the organic electroluminescence display substrate to the packaging cover plate.

According to the embodiments of the present disclosure, the buffer structure is provided between the box dam structure and the filling structure, and the viscosity of the second material is between that of the first material and that of the third material, and the buffer structure in the display panel is in a viscous state, and the box dam structure and the filling structure are in a cured state. It should be noted that the term "viscous state" in the present disclosure means that this structure still has a certain degree of viscosity after the display panel has been manufactured, that is to say, for example, the buffer structure is formed of a curable resin. This resin still has a certain viscosity after curing, that is, the buffer structure is in a gel-like state with a certain viscosity after curing. Therefore, on the one hand, in terms of viscosity, the transition from high viscosity of the box dam structure to low viscosity of the filling structure can be achieved, and the three materials that meet the abovementioned viscosity relationship make the manufacture process easier to be achieved. On the other hand, when the three materials are cured during the manufacture process, both the first material and the third material are hardened, and the second material is not hardened or is not completely hardened, that is, the second material has a certain degree of flexibility or elasticity, and the second material can use its own viscosity to relieve the glue flushing of the third material and buffer the deformation that occurs when the third material is cured, that is, the second material can buffer the curing of the first material and the third material, so as to ensure stability of the morphology of the box dam structure, alleviate the problems of bubbles, uneven edges and glue flushing at the junction of the box dam structure and the filling structure, and increase the reliability of the display panel. On the other hand, because the buffer structure can alleviate the problems of bubbles, uneven edges, and glue flushing at the junction of the box dam structure and the filling structure, the viscosity of the first material can be reduced and the selection range of the first material is increased, and the first material and the third material is easier to match.

Hereinafter, all the structures of the display panel will be described in detail according to specific embodiments of the present disclosure.

According to an embodiment of the present disclosure, the viscosity of the first material may be greater than 100000 cp. As a result, the first material has a strong viscosity, and the box dam structure formed after curing can form a sealing space of good sealing performance with the organic electroluminescence display substrate and the packaging cover plate. Compared with the related art, the viscosity of the box dam structure has a wider selection range (greater than 300000 cp), and it is easier to achieve the match with the material of the filling structure.

According to an embodiment of the present disclosure, the first material may include a resin material. As a result, the first material has a good water and oxygen barrier effect, so that the sealing assembly has a good sealing effect.

According to an embodiment of the present disclosure, the viscosity of the third material may be less than 1000 cp. As a result, the third material has good filling performance and certain viscosity, and the filling structure formed after curing can be well filled in the sealing space and connects the organic electroluminescence display substrate to the packaging cover plate.

According to an embodiment of the present disclosure, the third material may include at least one of a resin material, a silicon material, or an acrylic material. As a result, the third material has good water barrier and water absorption properties, making the sealing assembly have a good sealing effect.

Specific viscosity of the second material is not particularly limited, as long as the viscosity of the second material is between the viscosity of the first material and the viscosity of the third material, and those skilled in the art can design them according to specific conditions. For example, according to an embodiment of the present disclosure, the viscosity of the second material may be greater than 10000 cp. Therefore, regarding the viscosity, the transition from low viscosity to high viscosity can be achieved. Moreover, the viscosity of the second material is set in the above range, that is, the second material has a relatively high viscosity, which is beneficial to reduce the glue flushing phenomenon of the third material, and can further improve the stability of the morphology of the box dam structure and the sealing effect of the sealing assembly.

Specific components of the second material are also not particularly limited, as long as the second material is not affected by curing, that is, the second material should not be hardened after curing and still maintains a viscous state, and those skilled in the art can design it according to specific conditions. For example, according to an embodiment of the present disclosure, the second material may include a resin material, and the resin material is a resin material that remains in a viscous state after curing other than being hardened. As a result, the buffer structure can have a good water and oxygen barrier effect.

It should be noted that the buffer structure 320 includes the second material, the second material can be a resin material, and the above-mentioned viscosity of the second material is the viscosity of the resin material. In order to enhance the water and oxygen barrier performance of the buffer structure, the second material can also be doped with other functional particles.

For example, according to an embodiment of the present disclosure, the second material may also be doped with metal oxide. As a result, the water absorption performance of the buffer structure can be enhanced, and the water and oxygen barrier effect of the sealing assembly can be enhanced. The specific components of the metal oxide are not particularly limited, as long as the water absorption performance of the buffer structure can be enhanced. For example, according to specific embodiments of the present disclosure, the metal oxide may be calcium oxide.

According to an embodiment of the present disclosure, the second material may also be doped with nanoparticles. As a result, the buffer structure can be given with heat conduction, electric conduction or heat dissipation properties, improving the functionality of the sealing assembly. The specific components of thermally conductive, electrically conductive, and heat-dissipating nanoparticles are not particularly limited. For example, according to the embodiments of the present disclosure, nanoparticles such as aluminum oxide, gold, silver, and copper may be doped in the second material.

Figure 2:
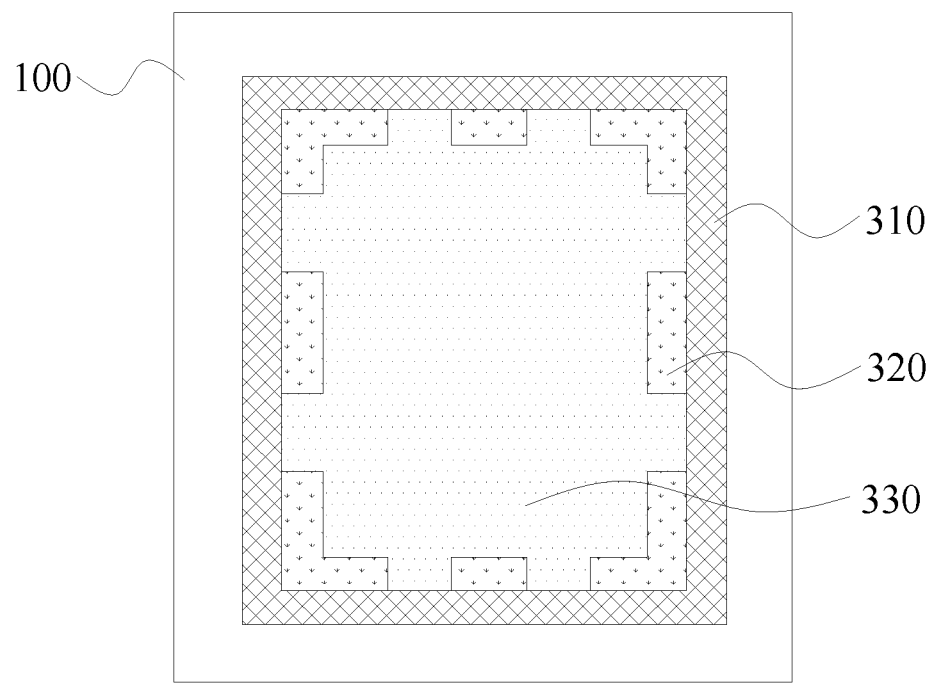
FIG. 2 shows a partial schematic structural diagram of a display panel according to an embodiment of the present disclosure.

According to an embodiment of the present disclosure, referring to FIG. 2, both the box dam structure 310 and the buffer structure 320 are a ring-shaped structure arranged at the edge of the organic electroluminescence display substrate 100. The box dam structure 310 is a continuous ring-shaped structure, so that it forms a sealing space with the organic electroluminescence display substrate and the packaging cover plate. The buffer structure 320 is located on the side of the box dam structure 310 close to the sealing space, and the filling structure 330 is filled in the sealing space. As a result, the buffer structure can effectively alleviate the problems of bubbles, uneven edges, and glue flushing at the junction of the box dam structure and the filling structure, and improve the packaging effect of the sealing assembly.

Specific structure of the buffer structure is not particularly limited. For example, according to an embodiment of the present disclosure, referring to FIG. 2, the buffer structure 320 may be a discontinuous ring-shaped structure, that is, the buffer structure 320 has openings. As a result, it can alleviate the problems of bubbles, uneven edges and glue flushing at the junction of the box dam structure and the filling structure, and improve the packaging effect of the sealing assembly. Size of the openings in the buffer structure is not particularly limited, and those skilled in the art can design it according to actual product requirements.

Figure 3:
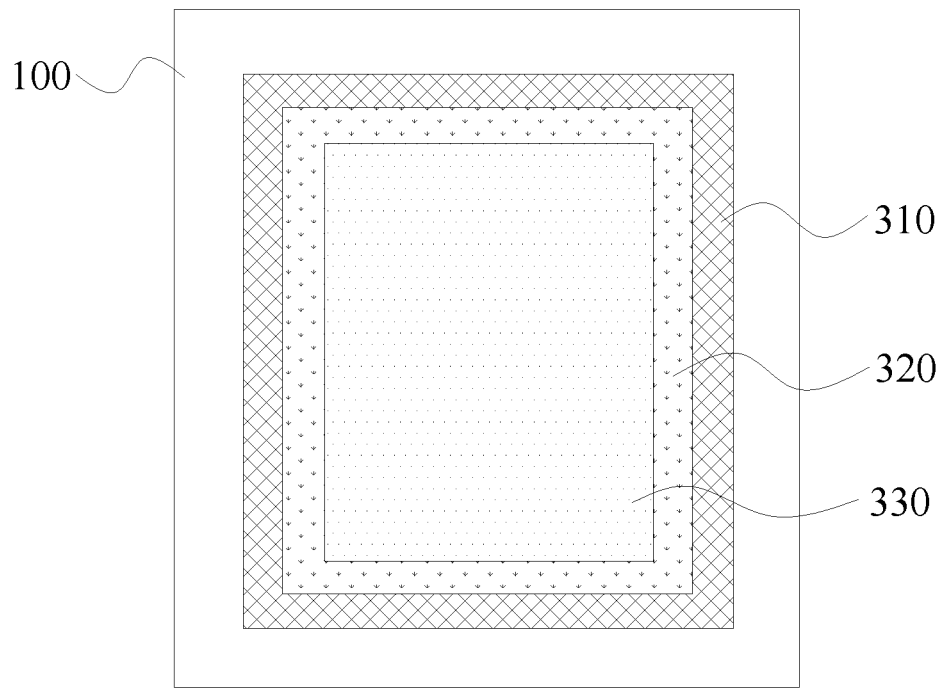
FIG. 3 shows a partial schematic structural diagram of a display panel according to another embodiment of the present disclosure.

Alternatively, according to other embodiments of the present disclosure, referring to FIG. 3, the buffer structure 320 may be a continuous ring-shaped structure, thereby further improving the sealing effect of the sealing assembly. Alternatively, the buffer structure can also be a structure with other patterns to realize buffering of different areas. The buffer structure is a continuous ring-shaped structure, which can further alleviate the problems of bubbles, uneven edges, and glue flushing at the junction of the box dam structure and the filling structure, and improve the packaging effect of the sealing assembly.

Figure 4:
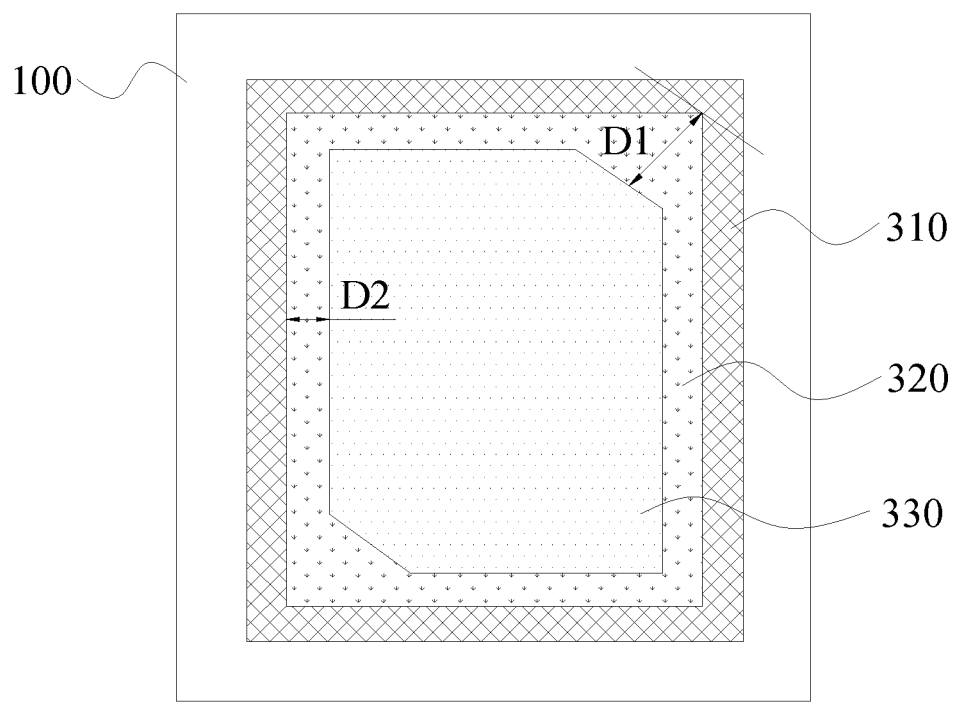
FIG. 4 shows a partial schematic structural diagram of a display panel according to a further embodiment of the present disclosure.

According to an embodiment of the present disclosure, on the basis of the buffer structure being a continuous ring-shaped structure or an intermittent ring-shaped structure, referring to FIG. 4, in a cross section of the buffer structure 320 along a plane where the organic electroluminescence display substrate 100 is located, the thickness (D1 as shown in the figure) of the buffer structure 320 at corners is greater than the thickness (D2 as shown in the figure) of the buffer structure at remaining areas. As a result, the water and oxygen barrier effect of the sealing assembly can be further enhanced. The inventor found that the corner areas of the box dam structure and the filling structure are more prone to have the glue flushing than other areas. In the embodiments of the present disclosure, the portions of the buffer structure at corners are widened, which can further alleviate the problems of bubbles, uneven edges, and glue flushing at the corners of the box dam structure and the filling structure, and improve the airtightness and reliability of the sealing assembly.

It should be noted that FIG. 4 only shows that the portions of the buffer structure at two corners are widened. The portion of the buffer structure at one corner may also be widened, or the portions of the buffer structure at all corners may be widened. The repetitious details do not need to be given here.

According to an embodiment of the present disclosure, the organic electroluminescence display substrate 100 has an organic light emitting diode (110 as shown in FIG. 1), the organic light emitting diode is located in the sealing space, the box dam structure and the buffer structure are arranged around the organic light emitting diode, and the filling structure is filled in the sealing space except the organic light emitting diode area. As a result, good sealing of the organic light emitting diode can be achieved. According to the embodiments of the present disclosure, in order to prevent the filling structure from adversely affecting the performance of the organic light emitting diode, a passivation layer may also be provided between the organic light emitting diode and the filling structure.

In another aspect of the present disclosure, the embodiments of the present disclosure provide a method of manufacturing a display panel. According to the embodiments of the present disclosure, the display panel manufactured by this method may be the display panel described above. Therefore, the display panel manufactured by this method has the same features and advantages as the display panel described above. The repetitious details do not need to be given here.

According to an embodiment of the present disclosure, the method includes: providing a packaging cover plate, coating the packaging cover plate with a first material for forming a box dam structure, a second material for forming a buffer structure, and a third material for forming a filling structure, a viscosity of the second material being greater than a viscosity of the third material and less than a viscosity of the first material; and aligning and fitting the display substrate with the packaging cover plate, and performing a curing treatment on the first material, the second material, and the third material to form the box dam structure, the buffer structure, and the filling structure, the box dam structure forming a sealing space with the display substrate and the packaging cover plate, the buffer structure and the filling structure being located in the sealing space, and the buffer structure being located between the box dam structure and the filling structure. The buffer structure after the curing treatment has viscosity. As a result, with this simple method, the problems of bubbles, uneven edges, and glue flushing at the junction of the box dam structure and the filling structure can be alleviated, the sealing effect of the sealing assembly is improved, and the reliability of the display panel is improved.

Figure 5:
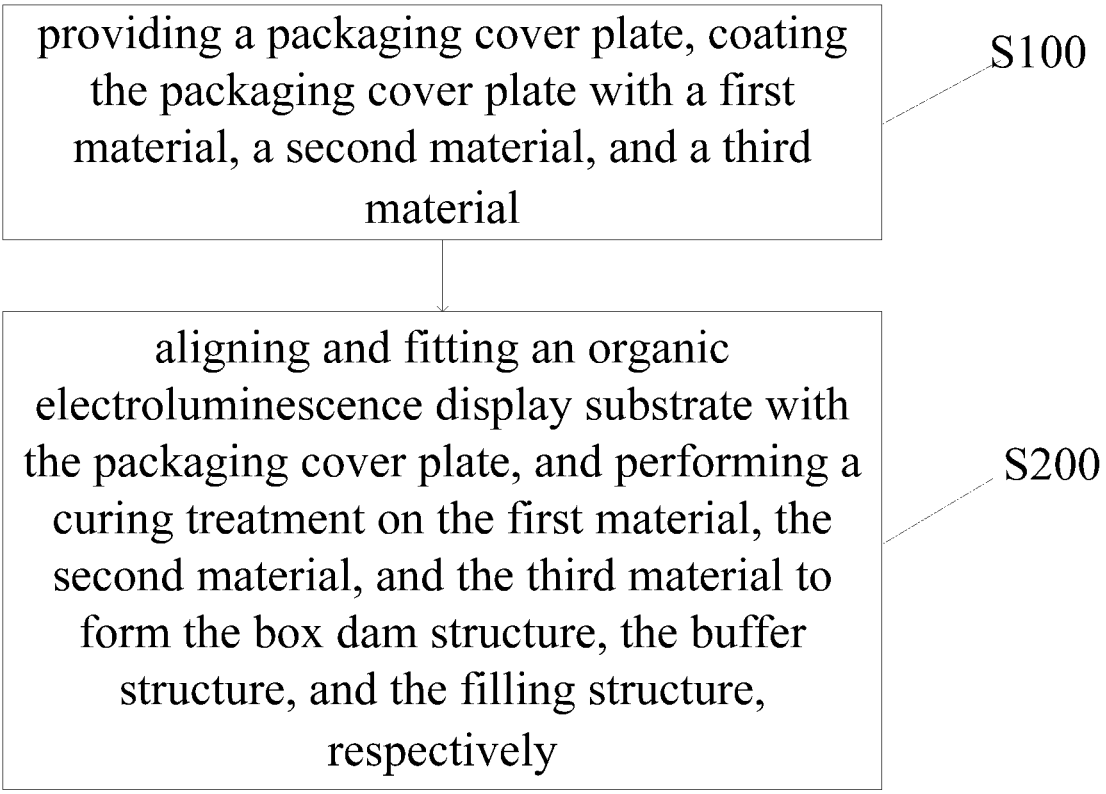
FIG. 5 shows a schematic flow chart of a method of manufacturing a display panel according to an embodiment of the present disclosure.

According to an embodiment of the present disclosure, referring to FIG. 5, the method includes:

S100: a packaging cover plate is provided, and the packaging cover plate is coated with a first material, a second material, and a third material.

According to an embodiment of the present disclosure, in this step, a packaging cover plate is provided, and the first material, the second material, and the third material are applied to the packaging cover plate. According to the embodiment of the present disclosure, the first material is configured to form the box dam structure, the second material is configured to form the buffer structure, the third material is configured to form the filling structure, and the viscosity of the second material is greater than the viscosity of the third material and less than the viscosity of the first material. As a result, the transition from high viscosity of the box dam structure to low viscosity of the filling structure can be achieved, and the three materials that meet the above-mentioned viscosity relationship make the manufacture process easier to be achieved.

The visibilities and compositions of the first material, the second material and the third material have been described in detail above. The repetitious details do not need to be given here.

According to the embodiment of the present disclosure, the first material is applied to the area of the packaging cover plate for forming the box dam structure, the second material is applied to the area for forming the buffer structure, and the third material is applied to the area for forming the filling structure. And the coating order of the first material, the second material and the third material is not particularly limited. After the three materials are subjected to subsequent curing treatments, the box dam structure, the buffer structure and the filling structure can be formed respectively. The box dam structure forms the sealing space with the organic electroluminescence display substrate and the packaging cover plate, the buffer structure and the filling structure are located in the sealing space, and the buffer structure is located between the box dam structure and the filling structure. The box dam structure, the buffer structure and the filling structure form the sealing assembly, which connects the organic light emitting display substrate to the packaging cover plate.

Shapes of the box dam structure, the buffer structure and the filling structure have been described in detail above. The repetitious details do not need to be given here. When applying the first material, the second material and the third material, they are just applied to the corresponding areas to form the corresponding shapes.

S200: the organic electroluminescence display substrate is aligned and fitted with the packaging cover plate, and a curing treatment is performed on the first material, the second material, and the third material to form the box dam structure, the buffer structure, and the filling structure, respectively.

According to an embodiment of the present disclosure, in this step, the organic electroluminescence display substrate is aligned and fitted with the packaging cover plate, and a curing treatment is performed on the first material, the second material, and the third material to form the box dam structure, the buffer structure, and the filling structure, respectively. According to the embodiment of the present disclosure, after curing, the first material and the third material are hardened to form the box dam structure and the filling structure, respectively. The second material is not hardened, and the formed buffer structure still maintains a viscous state. During the curing process, the second material can use its own viscosity to relieve the glue flushing of the third material and buffer the deformation that occurs when the third material is cured, that is, the second material can buffer the curing of the first material and the third material, so as to ensure stability of the morphology of the box dam structure, alleviate the problems of bubbles, uneven edges and glue flushing at the junction of the box dam structure and the filling structure, and increase the reliability of the display panel. And, because the buffer structure can alleviate the problems of bubbles, uneven edges, and glue flushing at the junction of the box dam structure and the filling structure, the viscosity of the first material can be reduced and the selection range of the first material is increased, and the first material and the third material is easier to match.

According to an embodiment of the present disclosure, the curing treatment may include ultraviolet light curing (such as ultraviolet light fast curing, ultraviolet light delayed curing), thermal curing, or visible light curing. Therefore, common curing methods can be used to cure the three materials, so that the first material is cured to form the box dam structure, the third material is cured to form the filling structure, and the second material is not affected by curing, so that the buffer structure maintains an uncured viscous state.

In another aspect of the present disclosure, an embodiment of the present disclosure provides a display apparatus. According to an embodiment of the present disclosure, the display apparatus includes the display panel described above. Therefore, the display apparatus has all the features and advantages of the display panel described above, and the repetitious details do not need to be given here. In general, the sealing assembly in the display apparatus has a good sealing effect, so that the display apparatus has a good display effect and a long service life.

The solutions of the present disclosure are described below through specific examples. It should be noted that the following examples are only used to illustrate the present disclosure and should not be regarded as limiting the scope of the present disclosure. Where specific techniques or conditions are not indicated in the embodiments, the procedures shall be carried out in accordance with the techniques or conditions described in the documents in the prior art or in accordance with the product specification.

First Example

The display panel includes an organic electroluminescence display substrate and a packaging cover plate opposite to each other, and a sealing assembly connecting the organic electroluminescence display substrate to the packaging cover plate. The sealing assembly includes a box dam structure, a buffer structure and a filling structure. The box dam structure forms a sealing space with the organic electroluminescence display substrate and the packaging cover plate. The buffer structure, the filling structure and the organic light emitting diode are located in the sealing space, the box dam structure and the buffer structure are both a continuous ring-shaped structure, and the filling structure is located on the side of the buffer structure away from the box dam structure and covers the organic light emitting diode. The viscosity of the material configured to form the box dam structure is 200,000 cp, the viscosity of the material configured to form the buffer structure is 50,000 cp, and the viscosity of the material configured to form the filling structure is 100 cp. Both the box dam structure and the filling structure are in a cured state. The buffer structure is in a viscous state.

When observing the boundary of the box dam structure with an electron microscope, no phenomenon such as bubbles, uneven edges, or glue flushing occurs at the boundary of the box dam structure.

First Comparative Example

The display panel of this comparative example is the same as that of the First Example, except that no buffer structure is provided in the sealing assembly, and the box dam structure is in direct contact with the filling structure.

When observing the junction of the box dam structure and the filling structure with an electron microscope, obviously a glue flushing phenomenon occurs at the junction of the two.

Second Comparative Example

The display panel of this comparative example is the same as that of the First Example, except that no buffer structure is provided in the sealing assembly, the box dam structure is in direct contact with the filling structure, the viscosity of the material configured to form the box dam structure is 300,000 cp, and the viscosity of the material configured to form the filling structure is 500 cp.

When observing the junction of the box dam structure and the filling structure with an electron microscope, obviously a glue flushing phenomenon occurs at the junction of the two.

In the description of the present disclosure, the orientation or positional relationship indicated by the terms "upper", "lower", etc. are based on the orientation or positional relationship shown in the drawings, which is only for the convenience of describing the present disclosure and does not require that the present disclosure must be constructed and operated in a specific orientation. Therefore, it cannot be understood as a limitation to the present disclosure.

In the description of this specification, the description with reference to the terms "one embodiment", "another embodiment", etc. means that specific features, structures, materials, or characteristics described in conjunction with the embodiment are included in at least one embodiment of the present disclosure. In this specification, the schematic representations of the above terms do not necessarily refer to the same embodiment or example. Moreover, the described specific features, structures, materials, or characteristics can be combined in any one or more embodiments or examples in an appropriate manner. In addition, those skilled in the art can combine and unite the different embodiments or examples and the features of the different embodiments or examples described in this specification without contradicting each other. In addition, it should be noted that in this specification, the terms "first" and "second" are only used for descriptive purposes, and cannot be understood as indicating or implying relative importance or implicitly indicating the number of indicated technical features.

Although the embodiments of the present disclosure have been shown and described above, it can be understood that the above-mentioned embodiments are exemplary and should not be construed as limiting the present disclosure. A person of ordinary skill in the art can make changes, modifications, substitutions and variants to the abovementioned embodiments within the scope of the present disclosure.

What is claimed is:
1. A display panel, comprising:
a display substrate;

a packaging cover plate opposite to the display substrate;
a sealing assembly located between the display substrate and the packaging cover plate, and connecting the display substrate to the packaging cover plate;
wherein the sealing assembly comprises a box dam structure, a buffer structure and a filling structure, the box dam structure forms a sealing space together with the display substrate and the packaging cover plate, the buffer structure and the filling structure are located in the sealing space, and the buffer structure is located between the box dam structure and the filling structure;
wherein the box dam structure is made of a first material, the buffer structure comprises a second material, the filling structure is made of a third material, and a viscosity of the second material before the second material is cured is greater than a viscosity of the third material before the third material is cured and less than a viscosity of the first material before the first material is cured.

2. The display panel according to claim 1, wherein the display substrate is an organic electroluminescence display substrate.

3. The display panel according to claim 1, wherein the buffer structure is flexible.

4. The display panel according to claim 1, wherein the viscosity of the second material is greater than 10000 cp.

5. The display panel according to claim 1, wherein the second material comprises a resin material.

6. The display panel according to claim 1, wherein the second material is doped with metal oxide.

7. The display panel according to claim 1, wherein the second material is doped with nanoparticles.

8. The display panel according to claim 1, wherein the box dam structure and the buffer structure are both a ring-shaped structure arranged at an edge of the display substrate, the buffer structure is located at a side of the box dam structure close to the sealing space, and the filling structure is filled in the sealing space.

9. The display panel according to claim 8, wherein the buffer structure has openings.

10. The display panel according to claim 8, wherein the buffer structure is a continuous ring-shaped structure.

11. The display panel according to claim 8, wherein in a cross section of the buffer structure parallel to the display substrate, a thickness of the buffer structure at a corner is greater than a thickness of the buffer structure at remaining areas.

12. The display panel according to claim 1, wherein the viscosity of the first material is greater than 100000 cp.

13. The display panel according to claim 1, wherein the first material comprises a resin material.

14. The display panel according to claim 1, wherein the viscosity of the third material is less than 1000 cp.

15. The display panel according to claim 1, wherein the third material comprises at least one of a resin material, a silicon material, or an acrylic material.

16. A method of manufacturing a display panel, comprising:
providing a packaging cover plate, coating the packaging cover plate with a first material for forming a box dam structure, a second material for forming a buffer structure, and a third material for forming a filling structure;
aligning and fitting a display substrate with the packaging cover plate, and performing a curing treatment on the first material, the second material, and the third material to form the box dam structure, the buffer structure, and the filling structure, the box dam structure forming a sealing space together with the display substrate and the packaging cover plate, the buffer structure and the filling structure being located in the sealing space, and the buffer structure being located between the box dam structure and the filling structure;
wherein a viscosity of the second material before the second material is cured is greater than a viscosity of the third material before the third material is cured and less than a viscosity of the first material before the first material is cured.

17. The method according to claim 16, wherein the display substrate is an organic electroluminescence display substrate.

18. The method according to claim 16, wherein the buffer structure after performing the curing treatment is flexible.

19. The method according to claim 18, wherein the curing treatment comprises an ultraviolet light curing, a thermal curing, or a visible light curing.

20. A display apparatus comprising the display panel according to claim 1.

* * * * *